(12) United States Patent
Takeuchi

(10) Patent No.: US 6,374,194 B1
(45) Date of Patent: Apr. 16, 2002

(54) SYSTEM AND METHOD OF DIAGNOSING PARTICLE FORMATION

(75) Inventor: Kazuo Takeuchi, Wako (JP)

(73) Assignee: The Institute of Physical and Chemical Research, Wako (JP)

( * ) Notice: Subject to any disclaimer, the term of this patent is extended or adjusted under 35 U.S.C. 154(b) by 0 days.

(21) Appl. No.: 09/288,667

(22) Filed: Apr. 9, 1999

(30) Foreign Application Priority Data

Apr. 14, 1998 (JP) .......................................... 10-102995

(51) Int. Cl.⁷ ................................................ G06F 11/30
(52) U.S. Cl. ...................... 702/182; 702/183; 700/110; 118/665
(58) Field of Search ................................ 702/130, 132, 702/182, 183, 35; 700/110; 427/534; 73/865.5; 436/36; 257/529; 118/665

(56) References Cited

U.S. PATENT DOCUMENTS 5,746,832 A * 5/1998 Chae et al. ................. 118/665
6,020,035 A * 2/2000 Gupta et al. ................ 427/534
6,192,287 B1 * 2/2001 Solomon et al. ............ 700/110

FOREIGN PATENT DOCUMENTS

JP        404343432 A * 11/1992 ................. 373/159

* cited by examiner

*Primary Examiner*—Joan Pendegrass
*Assistant Examiner*—Mohamed Charioui
(74) *Attorney, Agent, or Firm*—Jacobson Holman, PLLC

(57) ABSTRACT

A particle formation diagnosing system monitors the condition of particle formation in each of reaction chambers 1 of a semiconductor device fabricating line on the basis of data provided by a pressure measuring device 2a, a temperature measuring device 2b and a differential mobility analyzer 3 combined with each reaction chamber 1. The operation record recording unit 4a of the computer system 4 records data on the relation between the values of the operation parameters of each reaction chamber 1 and the amount of particles formed in the reaction chamber. Then, the operating condition determining unit 4b determines the optimum values for the operation parameters of the reaction chamber which will reduce the possibility of particle formation to the least possible extent on the basis of the data recorded by the operation record recording unit 4a.

5 Claims, 3 Drawing Sheets

SYSTEM AND METHOD OF DIAGNOSING PARTICLE FORMATION

BACKGROUND OF THE INVENTION

1. Field of the Invention

The present invention relates to techniques for a semiconductor device fabricating process for fabricating large-scale integrated circuits including VLSI circuits (very-large-scale integrated circuits) and ULSI circuits (ultralarge-scale integrated circuits) and, more particularly, to a system and a method of diagnosing particle formation to improve device yield when large-scale integrated circuits are mass-produced.

2. Description of the Related Art

A semiconductor device fabricating process for fabricating large-scale integrated circuits, such as VLSI circuits and ULSI circuits, has a plurality of steps including cleaning, oxidation, doping (ion implantation and annealing), thin film forming, lithographic and etching steps to build an integrated circuit on a silicon wafer.

The cleaning step removes contaminants formed by annealing and etching and adhering to the surface of the silicon wafer. The oxidation step forms a thin film for masking or insulation on the surface of the silicon wafer. The doping step dopes the silicon wafer with impurities to achieve various functional effects. The thin film forming step forms a thin film on the surface of the silicon wafer prior to the lithographic process and uses a chemical vapor deposition method (CVD method) using thermal reaction, photochemical reaction or plasma reaction, a physical vapor deposition method (PVD method) or a sputtering method. The lithographic step prints a circuit pattern on a resist film coating the surface of the silicon wafer. The etching step removes portions of a thin film formed on the surface of a silicon wafer not coated with a patterned resist film by etching using chemical reactions.

Generally, a semiconductor device fabricating process including those steps is carried out by a semiconductor device fabricating line constructed by installing, in a series arrangement, the respective reaction chambers of a cleaning system, a thermal oxidation system, an ion-implantation system, a CVD system, an exposure system and an etching system as shown in FIG. 1 illustrating the present invention. As shown in FIG. 1, a silicon wafer 10 having the shape of a circular disk is fed from the feed side of a semiconductor device fabricating line and is subjected to predetermined processes in reaction chambers 1 as the same is conveyed through the reaction chambers 1 to fabricate a plurality of integrated circuits 10a on the silicon wafer 10.

The performance of the semiconductor device fabricating line is evaluated in terms of throughput, process time and device yield (the ratio of the number of acceptable devices to the total number of integrated circuits). Device yield is an important parameter directly dominating the economic effect of the semiconductor device fabricating process. Referring to FIG. 3 showing a diagram of assistance in explaining the change of device yield of a general semiconductor device fabricating process, the rate of increase in the level of integration, i.e., the number of components per IC chip, every several years (about three years) has been about 400%, and semiconductor device fabricating processes of a new generation have been developed, constructed and applied to practical use in cycles of several years. In the initial stage A of practical application of a semiconductor device fabricating process of each generation, device yield is small and improvements are incorporated into the design of circuits and fabricating methods, and the full-scale mass production of semiconductor devices by the semiconductor device fabricating process is carried out in a mass production stage B. Sometimes, device yield drops suddenly as indicated at A1 or a decreases gradually as indicated at A2 in the initial stage A. Device yield in the mass production stage B, as compared with that in the initial stage A, is stabilized and varies in the range of about 80 to about 90%. Sometimes device yield drops as indicated at B1, B2 and B3 in the mass production stage B.

Particle contamination (PC) is a principal cause of device yield reduction among a very large number of causes of device yield reduction. Particle contamination is caused by particles accumulated on and falling off the inner surfaces of walls defining a reaction chamber and those adhering to operators, or particulate of diameters in the range of several micrometers to one nanometer emanating from a vapor phase prevailing in the reaction chamber. If such particles or particulates adhere to the surface of the silicon wafer, defects including pinholes, cracks or projections are formed in a thin film formed on the surface of the silicon wafer. Such defects cause troubles including disconnection, short circuit and deterioration in integrated circuits, and the integrated circuits are unable to function normally.

It has been general practice to detect the occurrence of particle contamination in a semiconductor device fabricating line by sampling some silicon wafers provided with semifinished integrated circuits from the semiconductor device fabricating line and inspecting the surfaces of the sample silicon wafers for particles adhering thereto with a microscope or the like to solve such a problem. Upon the detection of the occurrence of particle contamination through the inspection of the sample silicon wafers, the semiconductor device fabricating line is stopped, all the reaction chambers in steps preceding the step in which the contaminated sample silicon wafers were sampled are cleaned to avoid fabricating defective integrated circuits.

However, such a particle contamination preventing method needs to clean all the reaction chambers in the preceding steps including those not forming particles because the particle contamination preventing method is unable to specify the source and causes of particle formation, and cannot be effective measures to prevent particle contamination attributable to particles which cannot be removed by cleaning. Since the particle contamination preventing method needs to stop the semiconductor device fabricating line operating for mass production and the semiconductor device fabricating line requires much labor for restoration, the rate of operation of the semiconductor device fabricating line drops temporarily to zero and the productivity of the semiconductor device fabricating line is reduced.

SUMMARY OF THE INVENTION

Accordingly, it is an object of the present invention to provide a particle formation diagnosing system capable of enabling easy, reliable removal of particles causing particle contamination to improve the device yield of a semiconductor device fabricating line for mass-producing large-scale integrated circuits.

Another object of the present invention is to provide a particle formation diagnosing method to be carried out by the foregoing particle formation diagnosing system in accordance with the present invention.

According to a first aspect of the present invention, a particle formation diagnosing system comprises an operating condition monitoring unit for monitoring operation parameters of a reaction chamber, a particle analyzing unit for monitoring particle formation in the reaction chamber, and a computer system connected to the operating condition monitoring unit and the particle analyzing unit, in which the computer system comprises an operation record recording means for recording data on the relation between operation parameters of the reaction chamber and the amount of particles formed in the reaction chamber, and an operating condition determining means for determining optimum values for the operation parameters which will reduce the possibility of particle formation to the least possible extent on the basis of the data stored in the operation record recording means.

Preferably, the operation parameters to be monitored by the operating condition monitoring unit of the particle formation diagnosing system in the first aspect of the present invention include temperature, pressure and gas supplying condition in the reaction chamber. Preferably, the particle analyzing unit is a differential mobility analyzer (DMA). Preferably, the reaction chamber is incorporated into a semiconductor device fabricating line.

According to a second aspect of the present invention, a particle formation diagnosing method comprises the steps of monitoring operation parameters of a reaction chamber and condition of particle formation in the reaction chamber, recording data on the relation between operation parameters of the reaction chamber, and the amount of particles formed in the reaction chamber when values of the operation parameters of the reaction chamber are changed, and determining optimum values for the operation parameters which will reduce the possibility of particle formation to the least possible extent on the basis of the recorded data.

According to the first and the second aspect of the present invention, the data on the relation between the operation parameters of the reaction chamber and the amount of particles formed in the reaction chamber is recorded, and optimum values for the operation parameters which will reduce the possibility of particle formation to the least possible extent are determined on the basis of the recorded data. Accordingly, particle contamination of the reaction chamber in practical operation can easily and surely be prevented, so that the device yield of the semiconductor device fabrication line in mass-producing operation can be improved.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
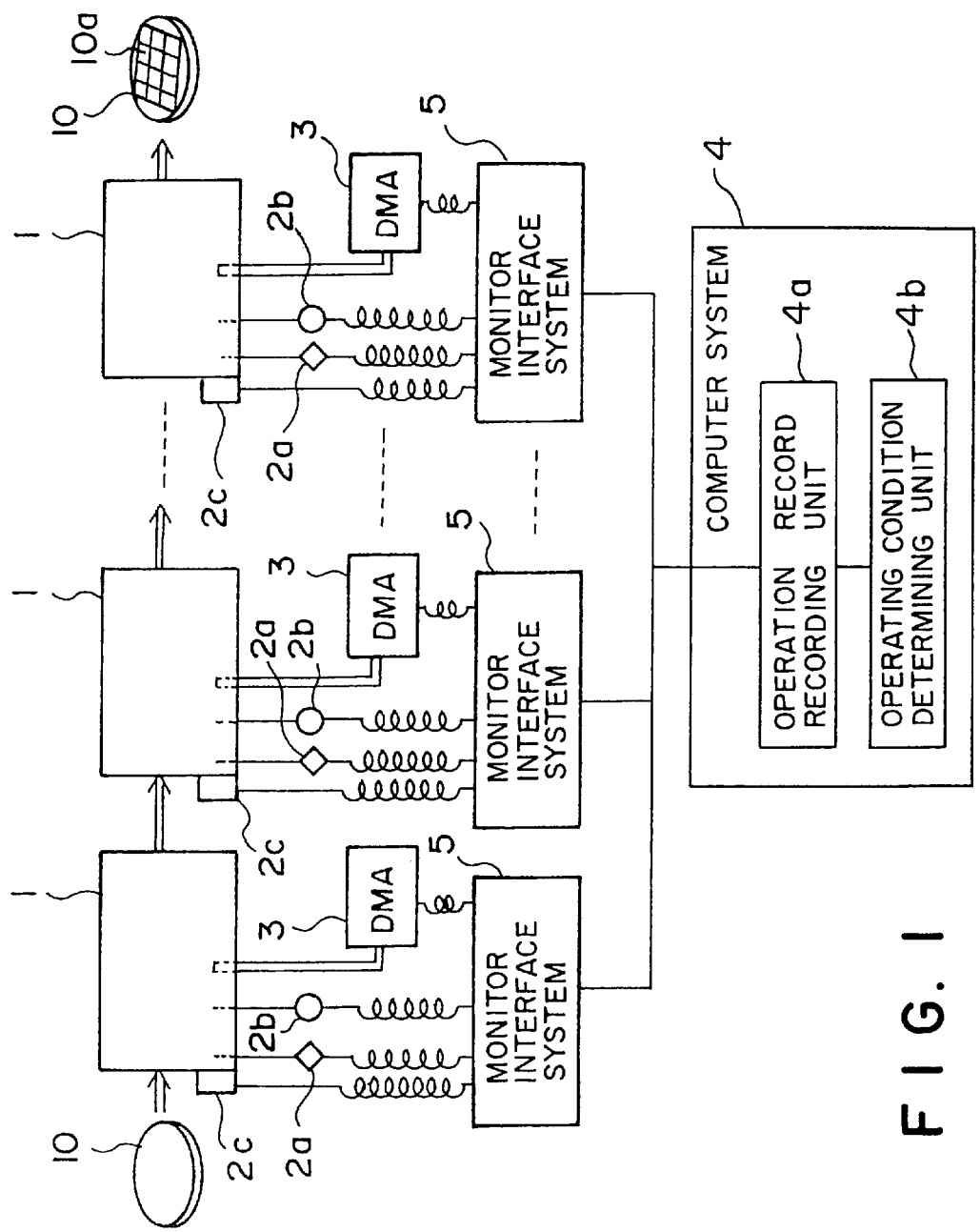
FIG. 1 is a block diagram of a semiconductor device fabricating line to which a particle formation diagnosing system in a preferred embodiment according to the present invention is applied.

A particle formation diagnosing system and a semiconductor device fabricating process to which the particle formation diagnosing system is applied will be described with reference to FIG. 1. The semiconductor device fabricating process is carried out by a semiconductor device fabricating line having, reaction chambers 1 respectively provided with a cleaning system, a thermal oxidation system, an ion-implantation system, a CVD system, an exposure system and an etching system installed in a series arrangement as shown in FIG. 1. A silicon wafer 10 having the shape of a circular disk is fed from the feed side of the semiconductor device fabricating line and is subjected to predetermined processes in the reaction chambers 1 as the same is conveyed through the reaction chambers 1 to fabricate a plurality of integrated circuits 10a on the silicon wafer 10. The predetermined processes are, for example, a cleaning process, an oxidation process, a doping process (ion implantation and annealing), a thin film forming process, a lithographic process and an etching process.

Each reaction chamber 1 is provided with an operating condition monitoring unit for monitoring the operation parameters of the chamber 1 in an on-line mode including a pressure measuring device 2a for measuring the pressure in the chamber 1, a temperature measuring device 2b for measuring the temperature in the chamber 1, a valve monitoring device 2c for monitoring the conditions of a gas supply valve and a gas discharge valve, and a differential mobility analyzer (DMA) 3 for analyzing particles sampled from the reaction chamber 1 under a normal or low pressure to monitor the formation of particles in the reaction chamber 1 in an on-line mode. The pressure measuring devices 2a, the temperature measuring devices 2b, the valve monitoring devices 2c and the differential mobility analyzers 3 are connected through monitor interface systems 5, respectively, to a computer system 4. The computer system 4 comprises an operation record recording unit (operation record recording means) 4a for recording data on the relation between operation parameters of each of the reaction chambers 1 and the amount of particles formed in each of the reaction chambers 1, and an operating condition determining unit (operating condition determining means) 4b for determining optimum values for the operation parameters which will reduce the possibility of particle formation to the least possible extent on the basis of the data recorded by the operation record recording unit 4a. The pressure measuring devices 2a, the temperature measuring devices 2b, the valve monitoring devices 2c, the differential mobility analyzers 3, the monitor interface systems 5 and the computer system 4 constitute the particle formation diagnosing system embodying the present invention.

The operation of the particle formation diagnosing system embodying the present invention will be described with reference to FIGS. 1 and 2. Optimum operating conditions for the semiconductor device fabricating line are determined beforehand through preliminary, experimental semiconductor device fabricating operation carried out under various operating conditions.

Data provided by the pressure measuring devices 2a, the temperature measuring devices 2b and the valve monitoring devices 2c installed on the reaction chambers 1 are transferred through the monitor interface systems 5 to the computer system 4 to monitor the operation parameters, i.e., temperature, pressure and gas supplying condition in the reaction chambers 1, in an on-line mode. Data provided by the differential mobility analyzers 3 are transferred through the monitor interface systems 5 to the computer system 4 to monitor the condition of formation of particles in the reaction chambers 1 in an on-line mode (step 101). When the values of the operation parameters, such as pressure, temperature or gas supplying condition (step 102), the operation record recording unit 4a of the computer system 4 records data on the relation between the values of the operation parameters of each reaction chamber 1 and the amount of particles formed in the reaction chamber (step 103). Steps 101 to 103 are executed for a predetermined period for preliminary experimental operations (step 104), and then the operating condition determining unit 4b of the computer system 4 determines optimum values for the operation parameters which will reduce the possibility of particle formation to the least possible extent on the basis of the data recorded by the operation record recording unit 4a (step 105).

Thus, the data on the relation between the values of the operation parameters of each reaction chamber 1 and the amount of particles formed in the reaction chamber is recorded, and optimum values for the operation parameters which will reduce the possibility of particle formation to the least possible extent are determined on the basis of the recorded data. Therefore, particle contamination in each reaction chamber 1 can easily and surely be prevented when the semiconductor device fabricating line operates for practical semiconductor device production. Consequently, the device yield of the semiconductor device fabricating line including the reaction chambers 1 can be improved when large-scale integrated circuits are mass-produced.

Although pressure, temperature and the condition of the valves in the reaction chamber 1 are controlled variables in this embodiment described above, various other stationary or unstationary operating conditions may be controlled.

Further, although optimum values for the operation parameters are determined on the basis of the relation between the values of the operation parameters of each reaction chamber 1 and the amount of particles formed in the reaction chamber in this embodiment described above, the optimum values for design parameters can be determined on the basis of the relation between the design parameters, for example, in terms of the shape, scale or position of the source gas inlet, and the amount of particles formed in the reaction chamber.

Description will be given of the operations of the particle formation diagnosing system when the semiconductor device fabricating line operates to form an insulating oxide film on the silicon wafer 10 in the reaction chamber 1 and to form a barrier layer on the silicon wafer 10 in the reaction chamber 1.

When forming an insulating oxide film on the silicon wafer 10 in the reaction chamber 1, a source gas, i.e., a mixture of silane gas ($SiH_4$) and oxygen gas ($O_2$), is supplied into the reaction chamber 1 adjusted to a pressure in the range of 10 to 760 Torr and heated at a temperature in the range of 500 to 800° C. When the temperature in the reaction chamber 1 is raised in this insulating oxide film forming process, the quality of the insulating oxide film is improved, while a precursor, such as silicon oxide (SiO), of a reaction product is produced in a high concentration in a vapor phase in the reaction chamber 1 and silicon oxide particles are formed in the vapor phase. If the temperature in the reaction chamber 1 is kept constant, silicon oxide particles in the vapor phase increases as the source gas concentration in the reaction chamber 1 increases.

Figure 2:
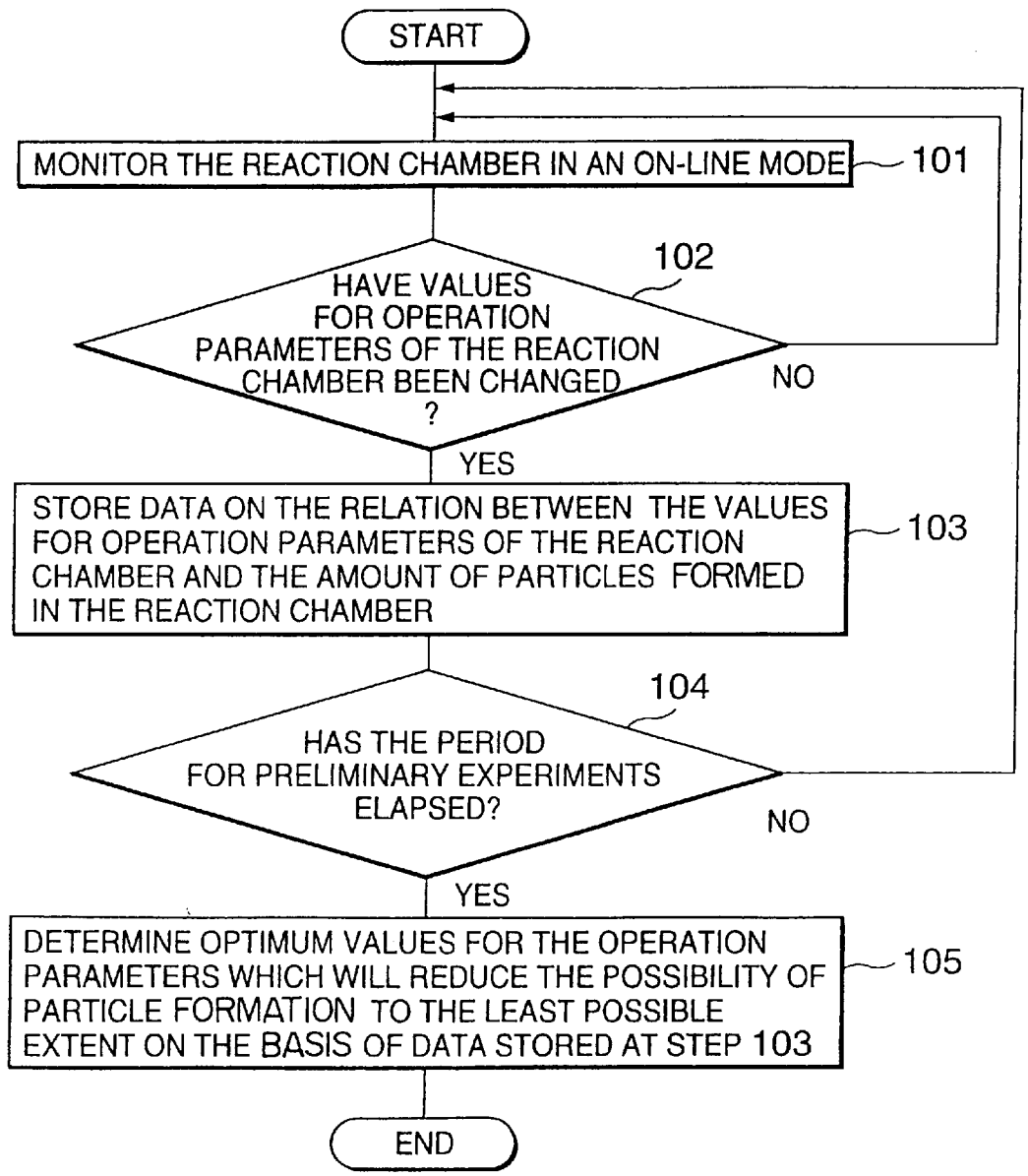
FIG. 2 is a flow chart of assistance in explaining the operation of the particle formation diagnosing system shown in FIG. 1.
Figure 3:
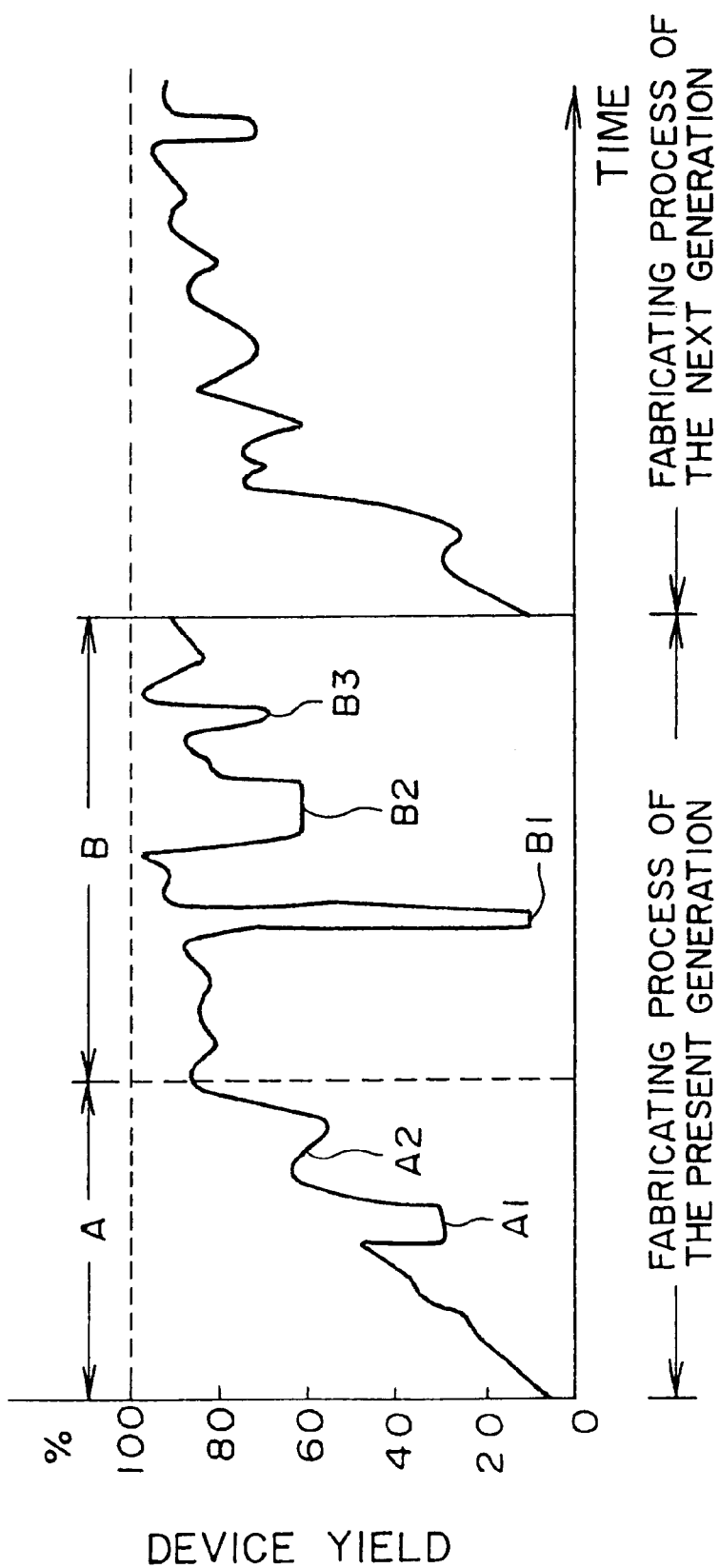
FIG. 3 is a diagram of explaining the change of the device yield of a general semiconductor device fabricating line.

Since the particle formation diagnosing system shown in FIGS. 1 and 2 has the computer 4 including the operation record recording unit 4a storing the data on the relation between temperature and pressure in the reaction chamber 1, and the amount of particles formed in the reaction chamber, the operating condition determining unit 4b is able to select an optimum combination of a temperature and a pressure which will reduce the possibility of particle formation to the least possible extent out of a plurality of temperature-pressure combinations stored in the operation record recording unit 4a. Consequently, the insulating oxide film can be formed on the silicon wafer 10 under the optimum operating conditions in a clean atmosphere not contaminated by particles when the semiconductor device fabricating line operates for practical semiconductor device production.

An operation for forming a barrier layer of titanium nitride (TiN) over a metal film formed on the silicon wafer 10 in the reaction chamber 1 will be described below. The barrier layer prevents the formation of a breakable, weal intermetallic compound due to direct contact between a metal layer overlying the barrier layer and a metal layer underlying the same. A mixed gas (source gas) of, for example, titanium tetrachloride gas ($TiCl_4$) and ammonia gas ($NH_3$) is supplied to the reaction chamber 1 adjusted to a pressure of several Torrs and heated at a temperature in the range of 400 to 500° C. Titanium nitride particles are formed in the reaction chamber 1 if a low-temperature source gas is supplied suddenly into the high-temperature reaction chamber 1 in this barrier layer forming process.

Data on the relation between the condition of the valves for regulating gas supplying condition in the reaction chamber 1, and the amount of particles formed in the reaction chamber is stored in the operation record recording unit 4a of the computer system 4 of the particle formation diagnosing system. Therefore, the operating condition determining unit 4b is able to select an optimum gas supplying condition which reduces the possibility of particle formation to the least possible extent out of a plurality of gas supplying conditions including gas supply rates stored in the operation record recording unit 4a. Consequently, the barrier layer can be formed on the metal film formed on the silicon wafer 10 under the optimum operating conditions in a clean atmosphere not contaminated by particles when the semiconductor device fabricating line operates for practical semiconductor device production.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A particle formation diagnosing system comprising:
   an operating condition monitoring unit that monitors operation parameters of a reaction chamber;
   a particle analyzing unit that analyzes an amount of particles emanating from a vapor phase prevailing in the reaction chamber; and
   a computer system connected to the operating condition monitoring unit and the particle analyzing unit;
   the computer system has an operation record recording means for recording data on a relation between operation parameters of the reaction chamber and an amount of particles formed in the reaction chambers; and
   an operating condition determining means for determining optimum values for operation parameters which will reduce the possibility of particle formation to the least possible extent on the basis of the data stored in the operation record recording means.

2. The particle formation diagnosing system according to claim 1, wherein the operation parameters to be monitored by the operating condition monitoring unit include temperature, pressure and gas supplying condition in the reaction chamber.

3. The particle formation diagnosing system according to claim 1, wherein the particle analyzing unit is a differential mobility analyzer capable of analyzing, under a normal pressure or a low pressure, particles sampled from the reaction chamber.

4. The particle formation diagnosing system according to claim 1, wherein the reaction chamber is incorporated into a semiconductor device fabricating line.

5. A particle formation diagnosing method comprising the steps of:

monitoring operation parameters of a reaction chamber and condition of particle formation in the reaction chamber;

recording data on a relation between operation parameters of the reaction chamber, and an amount of particles formed in the reaction chamber when values of the operation parameters of the reaction chamber are changed; and determining optimum values for operation parameters which will reduce the possibility of particle formation to the least possible extent on the basis of the recorded data.

* * * * *